United States Patent [19]

Estes

[11] Patent Number: 5,214,563

[45] Date of Patent: May 25, 1993

[54] THERMALLY REACTIVE LEAD ASSEMBLY AND METHOD FOR MAKING SAME

[75] Inventor: Howard S. Estes, Houston, Tex.

[73] Assignee: Compaq Computer Corporation, Houston, Tex.

[21] Appl. No.: 815,256

[22] Filed: Dec. 31, 1991

[51] Int. Cl.⁵ .............................................. H05K 7/20
[52] U.S. Cl. .................................... 361/386; 361/388; 361/389; 361/391; 361/400; 165/185; 174/16.3; 174/15.2; 439/66; 439/91
[58] Field of Search ............... 361/386, 387, 388, 389, 361/391, 392, 395, 396, 397, 400, 405, 408, 413, 417, 418, 419, 420; 174/16.3, 15.2, 260; 165/185; 357/70, 80, 81; 439/66, 91, 161; 337/140

[56] References Cited

U.S. PATENT DOCUMENTS 3,842,189 10/1974 Southgate ........................ 174/525
4,673,967 6/1987 Hingorany ........................ 357/70
4,949,223 8/1990 Achiwa ............................ 361/408
5,030,109 7/1991 Dery ................................ 439/66
5,035,628 7/1991 Casciotti et al. ................ 439/66
5,069,627 12/1991 Buck et al. ..................... 439/66

Primary Examiner—Leo P. Picard
Assistant Examiner—Young S. Whang
Attorney, Agent, or Firm—Synnestvedt & Lechner

[57] ABSTRACT

Thermally reactive lead assemblies and electronic circuits are provided which include a solderable, conductive metallic element having a first configuration at ambient temperature and a second expanded configuration at an elevated temperature, such as at soldering temperatures. The second configuration of the conductive metallic element provides electrical continuity between a pair of soldering locations of the electronic circuit, such as between a semiconductor device lead and a conductive surface on a printed circuit board.

21 Claims, 2 Drawing Sheets

THERMALLY REACTIVE LEAD ASSEMBLY AND METHOD FOR MAKING SAME

FIELD OF THE INVENTION

This invention relates to the manufacture of lead assemblies suitable for connecting semiconductor package devices to printed circuit boards, and more particularly, to leads which can be adapted to permit electrical continuity between various soldering locations without using additional printed circuit board surface area.

BACKGROUND OF THE INVENTION

Semiconductor devices traditionally have included a through-hole design in which leads extending from a device were bent downward and passed through plated holes in a printed circuit board to be soldered in place. More recently, surface mount technology has enabled double-sided board applications which double the useful surface area on a typical printed circuit board. Surface mount packages have also increased the useful surface area on each side of the board, since the lead wires of these components do not extend significantly beyond the molded package, and thus, less surface area is needed to secure the leads to the board.

Electronic device manufacturers are, nevertheless, still driven to minimize package dimensions. A minimum area package is advantageous in miniaturizing the size of consumer products, such as notebook computers. In certain aerospace applications, size and weight considerations continue to be of paramount importance. Additionally, heat removal management is often easier with smaller package designs.

One popular semiconductor package employed in many devices is a "J"-lead quad-pack which includes about 24 leads extending from an encapsulated chip. These leads extend out and are bent in a "J"-configuration around the plastic or ceramic encapsulation material. The displacement of the leads in a quad-pack causes them to extend slightly laterally from the package. Even if this distance appears minimal, any wasted circuit board surface area limits miniaturization. Moreover, since the number of lead connections extending from the encapsulated chip is usually limited by the amount of surface area extending along the periphery of the molded semiconductor package, this surface area has become a design limitation which can potentially inhibit the implementation of further improvements to integrated circuit density.

SUMMARY OF THE INVENTION

Improved lead assemblies are provided by this invention which are thermally reactive and which provide electrical continuity between pairs of soldering locations of an electronic circuit, such as between a lead location of a semiconductor device and a conductive surface on a printed circuit board. The lead assemblies of this invention include a solderable conductive metallic element having a first configuration at ambient temperature and a second, expanded configuration at an elevated temperature. The second expanded configuration provides contact between a pair of soldering locations of the electronic circuit.

Accordingly, the lead assemblies of this invention can be adapted to be placed well beneath the semiconductor package so as to not increase the overall surface area of the device. Valuable printed circuit board surface area can thus be maintained and conserved. The lead assemblies of this invention can also be provided with solder layers, so that upon heating the assembly to a soldering temperature and expanding the conductive metallic element, the element can be readily soldered to the conductive surface on the printed circuit board and to the device lead without the introduction of solder paste or additional molten solder. The lead assemblies of this invention are also completely portable and can be adjusted in a series of rows beneath the semiconductor package device so as to permit the use of greater lead densities.

In another aspect of the current invention, the conductive metallic elements of this invention can be configured in accordion and multiple helix shapes for providing the desired expansive characteristics when subjected to soldering temperatures. The selected alloys, for the conductive metallic members of this invention desirably contain cold work or residual stresses at ambient temperature, and become more relaxed and expand into an elongated shape at about 320°–400° C., a typical range of soldering temperatures.

BRIEF DESCRIPTION OF THE DRAWINGS

The accompanying drawings illustrate preferred embodiments of this invention so far devised for the practical application of the principles thereof, and in which.

DETAILED DESCRIPTION OF THE INVENTION

This invention provides thermally reactive lead assemblies, electronic circuits containing these assemblies, and methods for manufacturing lead assemblies. As used herein, the term "residual stress" refers to cold-working of a metallic substance so as to introduce dislocations in the metallic structure. The term "ambient temperature" refers to room temperature conditions and the term "soldering temperatures" refers to the art-recognized temperatures associated with solders, preferably of the lead-tin variety, for example, within a temperature range of about 320°–400° C. Additionally, the term "thermally reactive" means that the leads of this invention change shape or expand from a compressed configuration with the application of heat or thermal energy. The lead assemblies of this invention are suitable for conventional quad-packs, also called flat packs, as well as pin grid array devices, dual in-line packages, and all types of surface mount components. Other device applications will become readily apparent to those of ordinary skill in the art.

Referring now to FIGS. 1–4, there is shown a preferred manufacturing sequence for preparing a coil-configured lead 100 of this invention. With specific reference to FIG. 1, a conductive metallic element 10, for example low oxygen copper, such as oxygen-free grades C10100 and C10200, is rolled from bar or sheet stock and provided in a thickness of about 0.005–0.50 inch. The thin foil is then trimmed into individual elongated strips, typically about 0.01 inch in width. The strips are preferably dip tinned or plated with a tinning composition for example, lead-tin solder, to provide a tinning layer 20. Although copper has been suggested as the conductive metallic element, other materials may provide suitable expansion characteristics, such as silver and gold alloys and nickel-containing alloys, especially nickel-titanium alloys of approximately equi-atomic proportions which have been known to exhibit thermal expansion characteristic through changes in microstructure. One example, is NITINOL, has been known to provide shape memory characteristics when heated from ambient temperatures to elevated temperatures.

Figure 1:
FIG. 1: is a cross-sectional side view of a preferred metallic element coated with a tinning composition.
Figure 2:
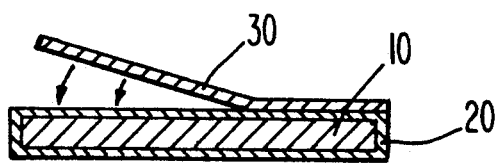
FIG. 2: is a cross-sectional side view of the metallic element of FIG. 1 illustrating the lamination of a solder layer onto one of its surfaces.
Figure 3:
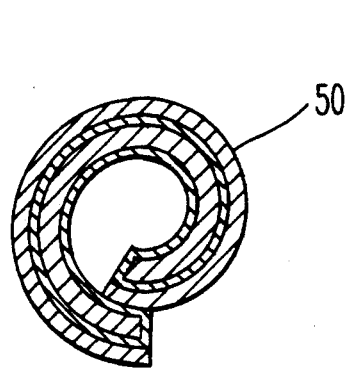
FIG. 3: is a cross-sectional side view of the composite lead of FIG. 2 after mechanically forming the lead into a coil.

Following the tinning operation, a solder layer 30 is preferably mechanically formed by rolling, laminating, or cladding to provide a mechanical bond with tinning layer 20, as described in FIG. 2. The solder may also contain a flux core or flux coating for promoting strong solder joints once soldering temperatures have been achieved during use. The solder coated lead is then ready for mechanical deformation.

Figure 4:
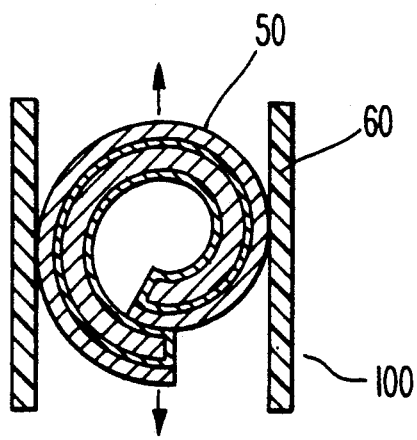
FIG. 4: is a cross-sectional side view of the coiled composite lead of FIG. 3 after the lead is inserted into a housing.

In order to introduce residual stresses into the coil-configured metallic element 50, the element is preferably cold-worked so as to introduce dislocations, or small imperfections into the grain structure. Cold-working deforms the element into a compressed shape which, upon thermal activation, is prone to anneal and relax. The annealing reduces the residual stresses and permits the deformed structure to straighten or elongate. This invention preferably takes further advantage of this expansion with the introduction of a housing 60, such as shown in FIG. 4, which restricts the lead's elongation in at least a first, preferably horizontal, direction which causes it to extend about perpendicularly from the first direction in a more verticle orientation towards the soldering junction locations, shown by the arrows.

The housing 60 of the resulting lead assembly 100 preferably is a non-conductive member, such as a polymer, for example, epoxy or nylon. A non-conductive member is preferred, since it is least likely to introduce shorts in the electronic circuity. As initially applied, the coilconfigured metallic element 50 is disposed within the housing 60 in a first, or compressed configuration.

Figure 5:
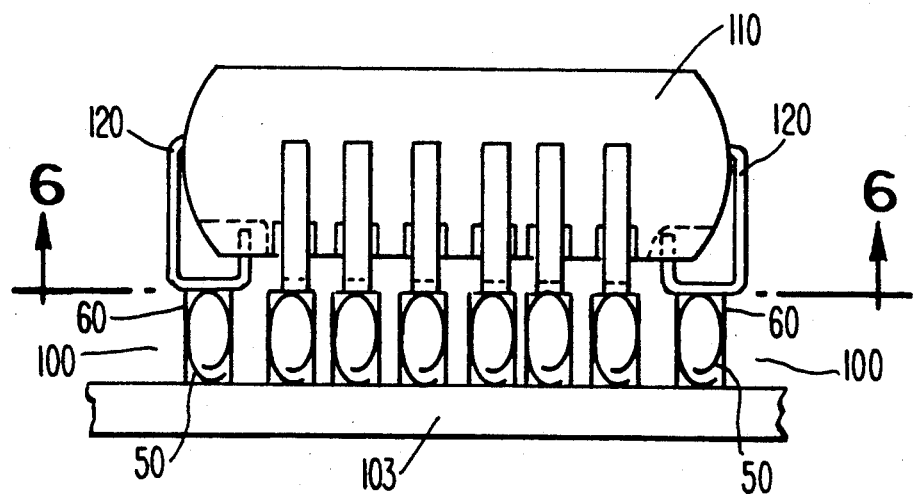
FIG. 5: is a side view of an electronic circuit employing a "J"-lead semiconductor quad-pack device soldered to a printed circuit board with a plurality of lead assemblies produced in accordance with this invention.

A preferred use for the lead assemblies of this invention will now be described with reference to FIGS. 5 and 6. These figures describe a semiconductor device including a plurality of "J" shaped leads 120 extending from a molded ceramic or plastic package 110. These leads 120, as they are typically employed in the art, extend from the package 110 a minimum distance defined by "t" in FIG. 6. Typically, the leads are soldered to conductive terminals, or "bumps" on the printed circuit board which further extend the overall surface area of the assembled package laterally from the molded package 110. As described in FIG. 5, the lead assemblies 100 of this invention can be located well beneath the molded package 110 so as to not increase the overall printed circuit board surface area used by the electronic device.

In accordance with one preferred application of this invention, a plurality of lead assemblies 100 are disposed beneath each "J"-lead of the package 110, preferably after the contact surfaces on the printed circuit board 103 and the leads 120 have been sufficiently fluxed. Upon reaching soldering temperatures typically employed for reflowing operations, such as a temperature of about 320°–400° C., preferably about 370° C., the solder layer 30 located on the coil-configured metallic element 50 melts to provide electrical continuity between the "J"-leads 120 and a conductive surface on the printed circuit board 103 through the metallic element 50. At the elevated soldering temperatures, the residual stresses of the cold-worked, metallic element 50 abate, and the element 50 attempts to relax to its original substantially straightened condition. This propensity to relax elongates the structure of the coilconfigured metallic element 50 along a direction which places it in contact with the "J"-lead 120 and the conducting surface of the printed circuit board 103. The combination of the molten solder and elongation of element 50 produce a sound electrical contact.

Figure 6:
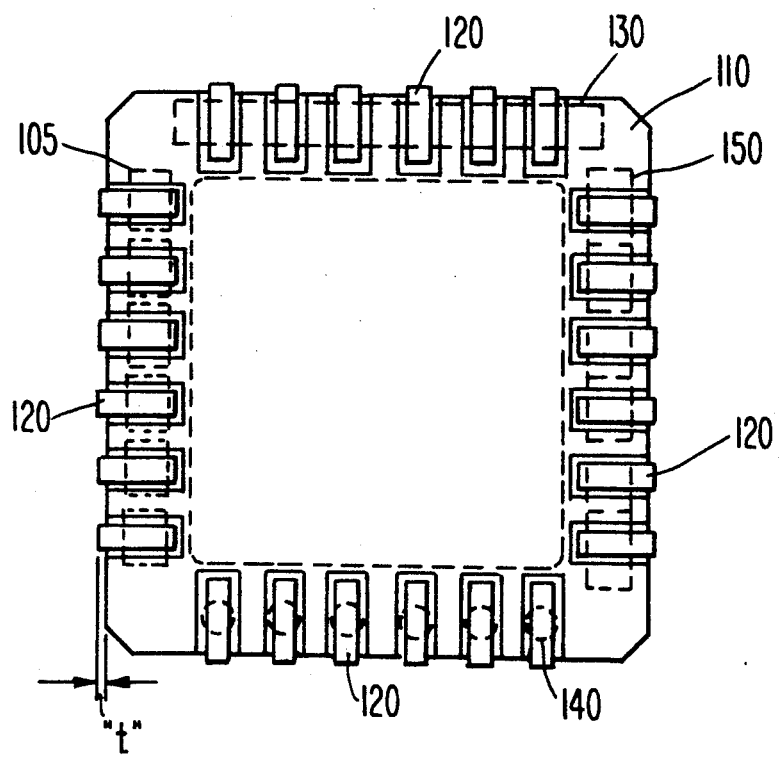
FIG. 6: is a cross-sectional bottom view of the lead assemblies and "J"-lead semiconductor device of FIG. 5.

As described in FIG. 6, the "J"-lead semiconductor device can include any number of configured lead assemblies and housings. The assemblies can be equipped with housings which include an elongated box-like structure 130, a box-like structure with individual separation panels 150, a plurality of circular housing tubes 140, or a plurality of rectangular housings 105 for containing the disclosed leads. Those of ordinary skill in the art will carefully weigh the efficiency of employing a series of lead assemblies connected to one another, such as housing embodiments 130 and 150, for individual packages of known design, versus the adaptability of employing individually housed leads, such as those described by housing embodiments 140 and 105.

Figure 7:
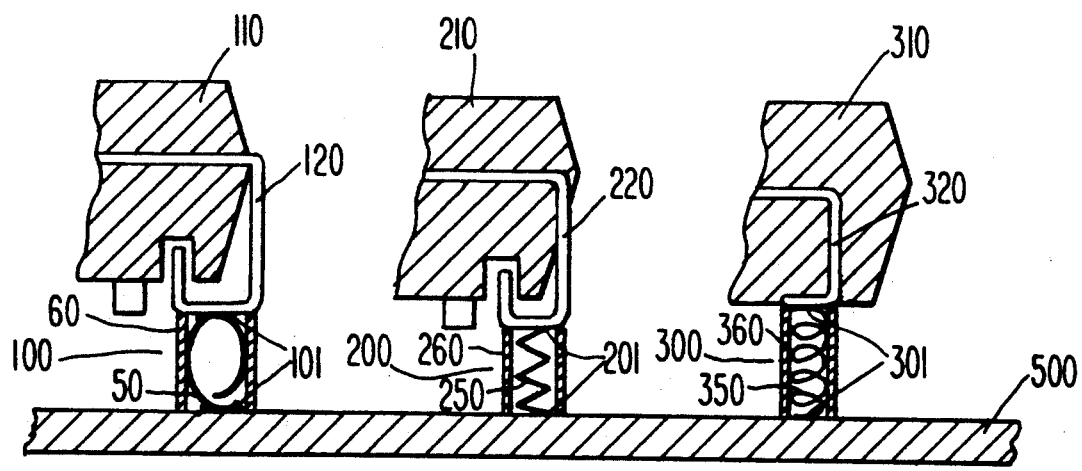
FIGS. 7a–c: are a series of partial cross-sectional views of three different electronic circuit assemblies including three separate lead configurations for semiconductor devices and three different lead configurations of this invention.

With reference to FIGS. 7a–c, there is described further variations for both semiconductor lead designs and shapes for the metallic elements of the lead assemblies of this invention. In the first embodiment described in FIG. 7a, a conventional "J"-lead device, as shown in FIGS. 5 and 6, is employed with a typically configured "J"-lead 120 which extends a distance "t", shown in FIG. 6, outwardly from the package 110. The lead assembly 100 described in FIG. 4 is disposed beneath the "J"-lead 120 and the entire device and printed circuit board 500 are exposed to elevated soldering temperatures. While being restrained in a horizontal direction by housing 60, the metallic element expands to contact the "J"-lead 120 and the conducting layer on the board 500. Simultaneously, the solder reflows to create solder joints 101. Upon returning to room temperature, these solder joints 101 provide both electrical continuity and a structural bridge between the "J"-lead 120 and the conducting surface of the printed circuit board 500.

With reference to FIG. 7b, there is shown an alternative embodiment which eliminates the extended portion "t" of the "J"-lead. This design employs a modified "J"-lead 220 which does not extend beyond an imaginary perpendicular line drawn along the outer periphery of the package 210. Although the amount of board space saved by this configuration appears minimal, the amount of surface area saved multiplied by the four sides of a typical quad-pack can amount to a significant savings in space when one considers the dozens of packages which may be included on typical printed circuit board. This shortened "J"-lead embodiment is shown coupled to a second lead assembly configuration 200. This lead assembly 200 includes a housing 260 enclosing an accordion-shaped metallic element 250. The accordion-shaped metallic element 250 also preferably includes residual stresses and extends axially to contact the modified "J"-lead 220 and a conducting surface of the printed circuit board 500 upon heating to soldering temperatures. A solder layer can also be incorporated onto this accordion shape at at least the end locations so that solder joints 201 can be provided upon reaching soldering temperatures.

Similarly, as described in FIG. 7c, a third lead assembly configuration 300 including a cold-worked, multiple helix metallic element 350 could be employed to provide electrical continuity. In this embodiment, the "J"-lead is eliminated entirely in favor of an encapsulated lead 320 disposed almost entirely within the housing 310. This encapsulated lead embodiment also completely eliminates the extended portion "t" of typically employed "J"-leads. Upon reaching soldering temperatures, the multiple helix metallic element 350 expands within housing 360 to contact the encapsulated lead 320 and a conducting surface on the printed circuit board 500. The multiple helix metallic element 350 also preferably includes a solder layer which melts upon reaching soldering temperatures to create solder joints 301. Various other lead configurations will become apparent to the art, since the only requirement is that the metallic elements expand to permit electrical contact prior to, or upon finally soldering the joint.

From the foregoing, it will be understood that this invention provides lead assemblies and electronic circuits for permitting electrical continuity without sacrificing printed circuit board surface area. The lead assemblies of this invention can be provided in multiple pre-packaged housings or as individual elements to provide both cost efficient assembly and unique adaptability to various lead arrangements and package designs. Although various embodiments have been illustrated, this was for the purpose of describing, and not limiting the invention. Various modifications will become apparent to one skilled in the art, and are considered within the scope of the attached claims.

What is claimed is:

1. A thermally reactive lead assembly comprising a solderable conductive metallic element having a first configuration including a compact shape at ambient temperature and a second expanded configuration at an elevated temperature for providing electrical continuity between a pair of soldering locations of an electronic circuit, said lead assembly further comprising housing means for limiting the expansion of said metallic element in a first direction upon transformation from said first to said second configuration.

2. The lead assembly of claim 1, wherein said metallic element comprises a solder layer disposed thereon.

3. The lead assembly of claim 2, wherein said metallic element comprises copper.

4. The lead assembly of claim 1, wherein said first configuration comprises a compact coil disposes within said housing means.

5. The lead assembly of claim 4, wherein said second configuration has a longer coil diameter than said compact coil.

6. The lead assembly of claim 1, wherein the electronic circuit comprises a semiconductor package device soldered to a printed circuit board.

7. The lead assembly of claim 6, wherein the electronic circuit comprises a personal computer.

8. A thermally reactive lead assembly comprising a solderable, conductive metallic element having a first compact configuration at ambient temperature and a second expanded configuration at an elevated temperature, said second configuration providing electrical continuity between a pair of soldering locations of an electronic circuit.

9. The lead assembly of claim 8, wherein said first configuration comprises a coil.

10. The lead assembly of claim 8, wherein said first configuration comprises an accordion-shaped member.

11. The lead assembly of claim 8, wherein said first configuration comprises a multiple helix.

12. The lead assembly of claim 8, wherein said conductive metallic element comprises a solder layer disposed substantially along one longitudinal side of said element.

13. The lead assembly of claim 12, wherein said conductive metallic element is disposed within a housing for limiting the horizontal expansion of said element as it transforms from said first configuration to said second expanded configuration.

14. The lead assembly of claim 13, wherein said housing comprises an individual tube disposed between a semiconductor package device and a printed circuit board.

15. A thermally reactive lead assembly for electrically joining an electronic device package with a printed circuit board, comprising:
a conductive metallic element having a solder layer disposed thereon at at least its joining locations, said metallic element having a first compact configuration containing residual stress at ambient temperature, and a second expanded configuration having reduced residual stress at soldering temperatures, said lead assembly further comprising a housing for limiting the horizontal expression of said metallic element as it expands from said first to said second configuration.

16. An electronic circuit comprising:
(a) a semiconductor package device including a plurality of leads extending therefrom;
(b) a printed circuit board having a plurality of conducting surfaces thereon; and
(c) a plurality of lead assemblies comprising a solderable conductive metallic element having a first compact configuration at ambient temperature and a second expanded configuration at an elevated temperature, said second configuration providing electrical continuity between said semiconductor package device and said conducting surfaces on said printed circuit board.

17. The electronic circuit of claim 16, wherein said solderable conductive metallic element comprises a solder layer for providing molten solder at said elevated temperature.

18. The electronic circuit of claim 17, wherein said first configuration is selected from the group comprising: a coil, an accordion member, and a multiple helix.

19. A method of manufacturing a thermally reactive lead assembly comprising:
providing a conductive metallic element;
adhering a solder layer onto said metallic element along a first surface thereof;
forming said metallic element into a first configuration, said first configuration including residual stress; and
disposing said formed metallic element into a housing means for limiting an expansion of said metallic element in a first direction when heated to an elevated temperature.

20. The method of claim 19, wherein said metallic element further comprises a tinning layer.

21. The method of claim 19, wherein said metallic element is formed into a configuration selected from the group including: a coil, an accordion member, and a multiple helix.

* * * * *